(12) United States Patent
Sekimoto (10) Patent No.: US 12,359,878 B2
(45) Date of Patent: Jul. 15, 2025

(54) DRYOUT DETECTION FOR COOLING DEVICE

(71) Applicant: Shimadzu Corporation, Kyoto (JP)

(72) Inventor: Shunsuke Sekimoto, Kyoto (JP)

(73) Assignee: SHIMADZU CORPORATION, Kyoto (JP)

( * ) Notice: Subject to any disclaimer, the term of this patent is extended or adjusted under 35 U.S.C. 154(b) by 389 days.

(21) Appl. No.: 17/438,082

(22) PCT Filed: Mar. 15, 2019

(86) PCT No.: PCT/JP2019/010937
§ 371 (c)(1),
(2) Date: Sep. 10, 2021

(87) PCT Pub. No.: WO2020/188651
PCT Pub. Date: Sep. 24, 2020

(65) Prior Publication Data
US 2022/0236018 A1    Jul. 28, 2022

(51) Int. Cl.
*F28D 15/00*  (2006.01)
*F28D 15/06*  (2006.01)

(52) U.S. Cl.
CPC ................... *F28D 15/06* (2013.01)

(58) Field of Classification Search
CPC .... F28D 15/06; F28D 15/0266; F28D 15/043; F25B 41/20; H05K 7/20309; H05K 7/20845; H05K 7/20381; H05K 7/20881
See application file for complete search history.

(56) References Cited

U.S. PATENT DOCUMENTS

| 4,750,543 A * | 6/1988 | Edelstein .............. F28D 15/043 |
| | | 126/645 |
| 10,107,167 B2 | 10/2018 | Hotta et al. |
| 2005/0005623 A1* | 1/2005 | Marsala ................ F25B 23/006 |
| | | 257/E23.098 |

(Continued)

FOREIGN PATENT DOCUMENTS

| JP | 2010133579 A * | 6/2010 | ......... F28D 15/0266 |
| JP | 2013088031 A | 5/2013 | |

(Continued)

OTHER PUBLICATIONS

JP-2010133579-A Machine Translation (Year: 2010).*

(Continued)

*Primary Examiner* — Travis Ruby
(74) *Attorney, Agent, or Firm* — Muir Patent Law, PLLC (57) ABSTRACT

A cooling device for performing cooling by utilizing latent heat of vaporization without a compressor and is provided with a liquid feeding unit for feeding a refrigerant, an evaporator for evaporating the fed refrigerant, a condenser for condensing the evaporated refrigerant, and a controller for controlling the flow rate of the refrigerant. The controller is configured to determine whether or not dryout has occurred based on the temperature of the evaporator and the refrigerant temperature of the evaporator, the dryout being defined as a state in which a gas-phase refrigerant is in contact with an inner surface of a refrigerant flow path of the evaporator.

9 Claims, 3 Drawing Sheets (56) References Cited

U.S. PATENT DOCUMENTS

| | | | |
|---|---|---|---|
| 2010/0032150 A1* | 2/2010 | Determan | ........... F28D 15/0266 |
| | | | 165/185 |
| 2012/0227954 A1 | 9/2012 | Uchida et al. | |
| 2013/0091881 A1 | 4/2013 | Ito et al. | |
| 2016/0047605 A1* | 2/2016 | Mishkinis | ............... F28D 15/06 |
| | | | 165/104.25 |

FOREIGN PATENT DOCUMENTS

| | | |
|---|---|---|
| JP | 2013-245875 A | 12/2013 |
| JP | 5835479 B2 | 12/2015 |
| WO | 2011/061952 A1 | 5/2011 |

OTHER PUBLICATIONS

Written Opinion for PCT application PCT/JP2019/010937 dated May 21, 2019 by the International Search Authority submitted with a machine translation.
Office Action dated Jan. 17, 2023 for corresponding Korean Patent Application No. KR 10-2021-7025653.

* cited by examiner

DRYOUT DETECTION FOR COOLING DEVICE

TECHNICAL FIELD

The present invention relates to a cooling device, and more particular to a cooling device for performing cooling by utilizing latent heat of vaporization without using a compressor.

BACKGROUND OF THE INVENTION

Conventionally, a cooling device for performing cooling by utilizing latent heat of vaporization without using a compressor is known. Such a cooling device is disclosed, for example, in Japanese Patent No. 5835479.

The above-described Patent No. 5835479 discloses an exhaust-heat recovery device (cooling device) for performing cooling by utilizing latent heat of vaporization of a refrigerant without using a compressor. When the temporal change in the temperature in the flow path of the refrigerant at the outlet of the evaporator is equal to or greater than a predetermined value, the exhaust heat recovery device is configured as follows. That is, the exhaust heat recovery device determines that it is in a dryout state in which the liquid phase of the refrigerant in the circulation path is insufficient, causing the deteriorated heat recovering efficiency.

PRIOR ART DOCUMENT

Patent Document

Patent Document 1: Japanese Patent No. 5835479

SUMMARY OF THE INVENTION

Problems to be Solved by the Invention

In the exhaust-gas heat recovery device (cooling device) disclosed in the above-described Japanese Patent No. 5835479, however, it is determined that the exhaust-gas heat recovery device is in a dryout state when the temporal change in the temperature in the refrigerant flow path is equal to or greater than a predetermined value. Therefore, there is a disadvantage that it cannot be determined as a dryout state unless the dryout state has proceeded and the temperature of the refrigerant at the evaporator outlet has started to rise. That is, even in a case where the liquid phase of the refrigerant is insufficient, when two phases of the refrigerant, i.e., the gas-phase refrigerant and the liquid-phase refrigerant, exist in the flow path, the heat will be recovered as the latent heat of vaporization. Therefore, the temperature of the refrigerant will not rise until the refrigerant has completely changed to the gas phase. For this reason, it is impossible to determine that it is in a dryout state until the refrigerant has completely changed to the gas phase. As a result, it is difficult to quickly detect the occurrence of dryout.

The present invention has been made to solve the above-described problems. One of the objects of the present invention is to provide a cooling device capable of quickly detecting the occurrence of dryout.

Means for Solving the Problem

In order to attain the above-described object, a cooling device according to one aspect of the present invention is a cooling device for performing cooling by utilizing latent heat of vaporization without using a compressor. The cooling device is provided with: a liquid feeding unit configured to feed a refrigerant; an evaporator configured to evaporate the fed refrigerant; a condenser configured to condense the evaporated refrigerant; and a controller configured to control a flow rate of the refrigerant. The controller is configured to determine whether or not dryout has occurred based on a temperature of the evaporator and a refrigerant temperature of the evaporator, the dryout being defined as a state in which a gas-phase refrigerant is in contact with an inner surface of a refrigerant flow path of the evaporator.

In the cooling device according to one aspect of the present invention, it is determined whether or not the dryout has occurred, based not only on the temperature of the refrigerant temperature but also on the temperature of the evaporator as described above. Therefore, even in a case where the temperature of the refrigerant of the evaporator does not rise, it is possible to determine that dryout has occurred based on the temperature rise of the evaporator caused by the decreased heat transfer coefficient due to the occurrence of dryout. Thus, it is possible to detect the occurrence of dryout without waiting until the refrigerant temperature has risen and the temporal change of the refrigerant temperature has increased. Therefore, the occurrence of dryout can be detected quickly. Consequently, it is possible to suppress the deterioration of the cooling efficiency of the cooling device, which can prevent the temperature rise of the cooling target (heat source). Further, in a case of a cooling device for performing cooling by utilizing latent heat of vaporization without using a compressor, as compared with the case of using a compressor that requires higher output than in a liquid feeding unit, it is possible to simplify the equipment configuration and reduce the size of the equipment. Further, in a case of a cooling device for performing cooling by utilizing latent heat of vaporization without using a compressor, as compared with a case of using only the temperature change (sensible heat) of the refrigerant without utilizing latent heat of vaporization, it is possible to reduce the circulation volume of the refrigerant, so that the output of the liquid feeding unit can be reduced. This also makes it possible to reduce the size of the equipment. Such an effect is particularly useful in the case of using a cooling device in a moving body in which miniaturization of a device to be mounted is desired.

In the cooling device according to one aspect of the present invention, the controller is configured to determine that the dryout has occurred on the inner surface of the refrigerant flow path of the evaporator when a difference between a temperature of the vicinity of the refrigerant flow path at an outlet of the evaporator and a refrigerant temperature at the outlet of the evaporator is equal to or greater than a threshold temperature difference based on a design value of an amount of heat generation of a heat source. With this configuration, it is possible to determine the discrimination between the case in which the heat input to the evaporator is large and the case in which dryout has occurred, based on the temperature difference between the temperature of the vicinity of the refrigerant flow path at the outlet of the evaporator and the refrigerant temperature at the outlet of the evaporator as a reference based on the design value of the amount of heat generation of the heat source. Therefore, it is possible to easily determine whether or not dryout has occurred.

In the cooling device according to one aspect of the present invention, when the controller determines that the dryout has occurred on the inner surface of the refrigerant flow path of the evaporator, the controller is configured to perform control to increase a flow rate of the refrigerant to be fed to the evaporator. With this configuration, it is possible to increase the flow rate of the liquid-phase refrigerant to be fed to the evaporator based on the occurrence of the rapidly detected dryout. Therefore, dryout can be quickly prevented.

In the cooling device according to one aspect of the present invention, the cooling device is further provided with a temperature sensor provided in the vicinity of the refrigerant flow path near the outlet of the evaporator, and the controller is configured to acquire the temperature of the evaporator by the temperature sensor. With this configuration, since the temperature sensor is provided in the vicinity of the refrigerant flow path near the outlet of the evaporator where refrigerant vaporization most occurs, it is possible to detect dryout more quickly based on the temperature of the temperature sensor.

In the cooling device according to one aspect of the present invention, preferably, the cooling device includes a plurality of the evaporators, and the liquid feeding unit includes a pump capable of feeding the refrigerant to the plurality of the evaporators. The cooling device is further provided with a plurality of flow rate control valves each for adjusting a flow rate of the refrigerant to each of the plurality of evaporators. When the controller determines that the dryout has occurred in at least one of the plurality of the evaporators, the controller is configured to perform control of the flow rate control valve corresponding to the at least one of the plurality of the evaporators in which the dryout has occurred so as to increase the flow rate of the refrigerant to be supplied to the at least one of the plurality of the evaporators. With this configuration, in a case where a plurality of evaporators is provided for one liquid feeding unit, the occurrence of dryout can be quickly detected for each of a plurality of evaporator, and dryout of the evaporator in which dryout has occurred can be quickly solved.

In the cooling device according to one aspect of the present invention, preferably, the evaporator is configured to be in contact with a heat source to remove the heat of the heat source by heat conduction. With this configuration, unlike the case in which air is cooled by an evaporator and the heat source is cooled by blowing the cooled air, it is possible to directly cool the heat source. Thus, since it is not necessary to provide a device for blowing air, the apparatus configuration can be simplified. Further, since it is not necessary to provide a space for blowing air, the device can be reduced in size.

In the cooling device according to one aspect of the present invention, the refrigerant has a boiling point of 15° C. or above and 50° C. or below. With this configuration, since the boiling point (liquefaction temperature) is close to the normal temperature, the gas-phase refrigerant can be easily liquefied by the condenser without using a compressor. Note that the boiling point denotes a boiling point at a pressure in the evaporator.

In the cooling device according to one aspect of the present invention, the cooling device is configured to cool an electronic device. With this configuration, it is possible to efficiently cool an electronic device by the cooling device capable of quickly detecting the occurrence of dryout.

In the cooling device according to one aspect of the present invention, preferably, the cooling device is configured to be mounted on a moving body. With this configuration, it is possible to efficiently cool the heat source mounted on the moving body by the cooling device capable of quickly detecting the occurrence of dryout.

Effects of the Invention

As described above, according to the present invention, it is possible to quickly detect the occurrence of dryout.

EMBODIMENTS FOR CARRYING OUT THE INVENTION

Hereinafter, some embodiments in which the present invention is embodied will be described with reference to the attached drawings.

Cooling Device Configuration

Referring to FIGS. 1 to 7, the configuration of a cooling device 100 according to one embodiment of the present invention will be described.

Figure 1:
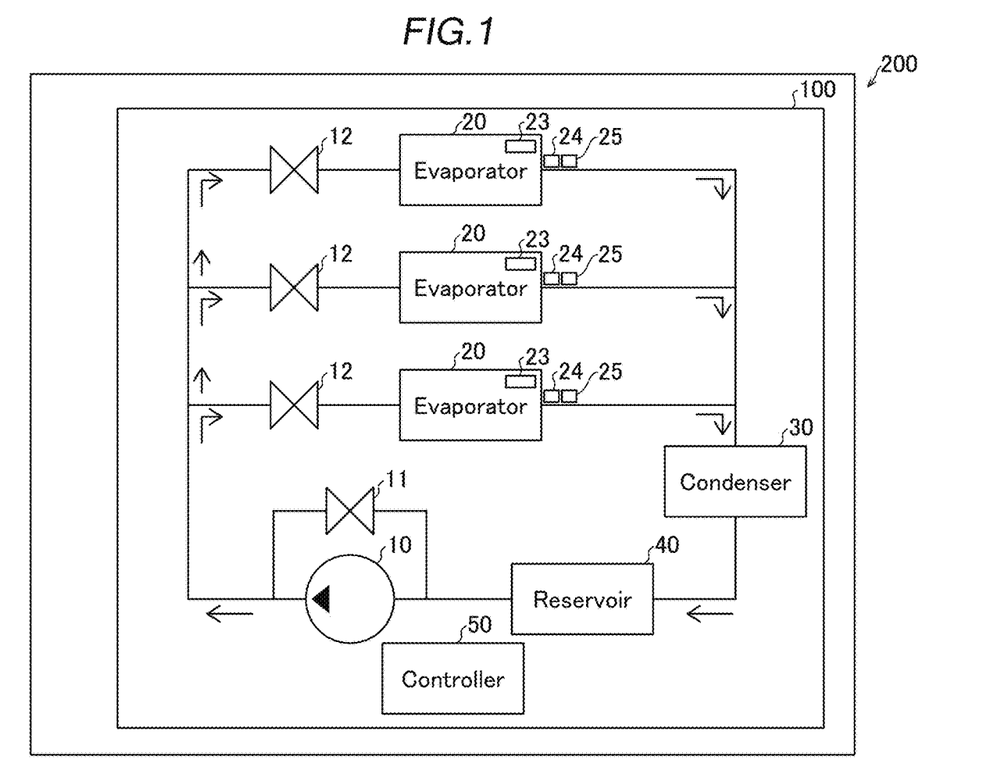
FIG. 1 is a block diagram showing the configuration of a cooling device according to one embodiment of the present invention.
Figure 2:
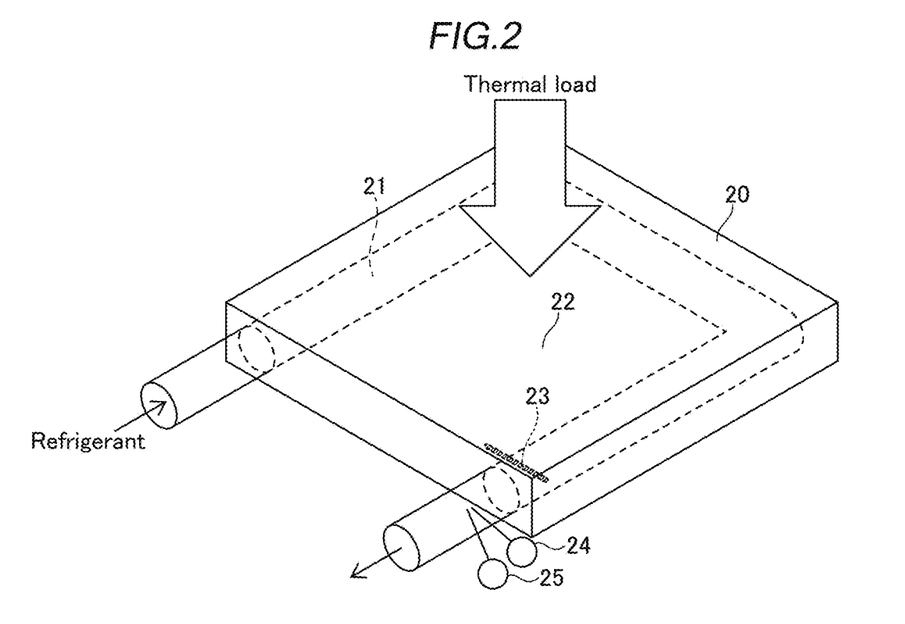
FIG. 2 is a schematic diagram showing an evaporator of the cooling device according to one embodiment of the present invention.

The cooling device 100 according to one embodiment of the present invention is a cooling device for performing cooling by utilizing latent heat of vaporization without using a compressor as shown in FIG. 1. Specifically, the cooling device 100 is provided with a pump 10, a plurality of evaporators 20, a condenser 30, a reservoir 40, and a controller 50. The cooling device 100 is provided with an adjustment valve 11 and a plurality of flow rate control valves 12. Further, the evaporator 20 is provided with, as shown in FIG. 2, a refrigerant flow path 21 and a main body 22. Further, the evaporator 20 is provided with a temperature sensor 23, a refrigerant temperature sensor 24, and a refrigerant pressure sensor 25. Note that the pump 10 is an example of the "liquid feeding unit".

Figure 3:
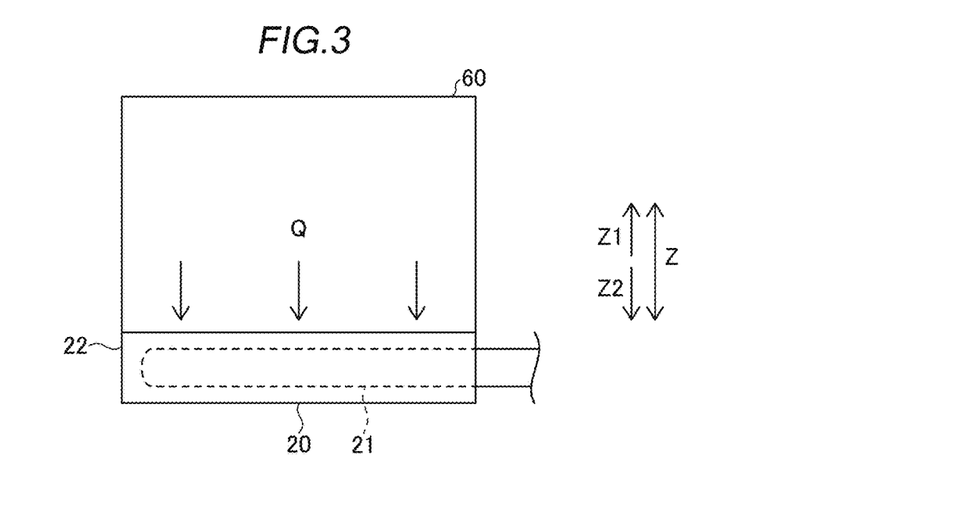
FIG. 3 is a diagram showing a cooling device according to one embodiment of the present invention and an electronic device as a heat source.

Further, as shown in FIG. 3, the cooling device 100 is configured to cool an electronic device 60. That is, the evaporator 20 is in contact with the electronic device 60 (heat source) and is configured to remove the heat of the electronic device 60 (heat source) by heat conduction.

The cooling device 100 is configured to circulate a refrigerant to cool the electronic device 60 as a heat source. The refrigerant has a boiling point of 15° C. or above and 50° C. or below at a pressure in the evaporator 20. The refrigerant is, for example, freon. The refrigerant is, for example, freon of R245fa (boiling point of 15.3° C. at an atmospheric pressure).

Further, as shown in FIG. 1, the cooling device 100 is configured to be mounted on the moving body 200. The moving body 200 can be, for example, a vehicle, a ship, an airplane, and the like.

The pump 10 is configured to feed a refrigerant. The pump 10 is operated by an output in a predetermined range. The pump 10 is configured to feed a refrigerant in a liquid state. Further, the pump 10 is configured to be capable of feeding the refrigerant to the plurality of evaporators 20. The pump 10 is configured to send a refrigerant from the reservoir 40 to the plurality of evaporators 20.

The adjustment valve 11 is provided in the flow path for bypassing the pump 10. The adjustment valve 11 is provided to adjust the flow rate of the refrigerant fed by the pump 10. Specifically, when the opening degree of the adjustment valve 11 is increased (opened), the flow rate of the refrigerant to be bypassed is increased, and the flow rate of the refrigerant to be fed to the evaporator 20 is reduced. On the other hand, when the opening degree of the adjustment valve 11 is decreased (narrowed), the flow rate of the refrigerant to be bypassed is reduced, and the flow rate of the refrigerant to be fed to the evaporator 20 is increased. The opening degree of the adjustment valve 11 is adjusted by the controller 50.

A plurality of the flow rate control valves 12 is provided for adjusting the flow rate of the refrigerant to the plurality of evaporators 20. Specifically, the flow rate control valve 12 is provided on the upstream of each of the plurality of evaporators 20. The flow rate control valve 12 is configured to adjust the flow rate of the refrigerant to be fed to the downstream evaporator 20 by adjusting the opening degree. When the opening degree of the flow rate control valve 12 is increased (opened), the flow rate of the refrigerant to be fed to the downstream evaporator 20 increases. On the other hand, when the opening degree of the flow rate control valve 12 is reduced (narrowed), the flow rate of the refrigerant to be fed to the downstream evaporator 20 reduces. Each flow rate control valve 12 is adjusted in the opening degree by the controller 50.

The evaporator 20 is configured to evaporate the fed refrigerant. Specifically, the refrigerant flows through the refrigerant flow path 21 provided in the main body 22 of the evaporator 20, and the heat is conducted from the heat source through the main body 22 and the refrigerant flow path 21. The refrigerant evaporates (vaporizes) in the refrigerant flow path 21 when heated. The evaporator 20 is configured to cool the heat source by removing the heat of the heat source by the latent heat of vaporization (vaporization heat) of the refrigerant. Note that the refrigerant flow path 21 shown in FIG. 2 is a schematic one. That is, the refrigerant flow path 21 may have a structure that bends in the main body 22 by a plurality of times in order to perform efficient heat exchanging. Further, the refrigerant flow path 21 may be formed to be branched into a plurality of flow paths at the inlet and merged into one flow path at the outlet after passing through the main body 22.

The refrigerant flow path 21 is made of a metallic material. The refrigerant flow path 21 is made of, for example, a stainless-steel material, an aluminum material, or a copper material. The refrigerant flow path 21 is formed in a pipe-shape. The main body 22 is made of a metal material. The main body 22 is made of, for example, a stainless-steel material, an aluminum material, or a copper material. Further, the refrigerant flow path 21 is formed so as to extend in a horizontal direction.

The gas-liquid two-phase refrigerant exited from the outlet of the evaporator 20 is fed to the condenser 30.

As shown in FIG. 2, the temperature sensor 23 is provided in the vicinity of the refrigerant flow path 21 near the outlet of the evaporator 20. Specifically, the temperature sensor 23 is provided above the refrigerant flow path 21 in the vicinity of the outlet of the evaporator 20. That is, the temperature sensor 23 is configured to measure the temperature of the main body 22 above the refrigerant flow path 21 in the vicinity of the outlet of the evaporator 20. The temperature sensor 23 is configured to transmit the measured temperature to the controller 50.

The temperature sensor 23 is inserted into the hole provided in the main body 22. The temperature sensor 23 includes a resistance temperature detector or a thermocouple. The temperature sensor 23 measures the temperature of the inner wall of the refrigerant flow path 21 in the vicinity of the outlet of the evaporator 20.

The refrigerant temperature sensor 24 is configured to measure the temperature of the refrigerant in the refrigerant flow path 21 in the vicinity of the outlet of the evaporator 20. The refrigerant temperature sensor 24 is configured to transmit the measured temperature to the controller 50.

The refrigerant pressure sensor 25 is configured to measure the pressure of the refrigerant in the refrigerant flow path 21 in the vicinity of the outlet of the evaporator 20. The refrigerant pressure sensor 25 is configured to transmit the measured pressure to the controller 50.

The condenser 30 is configured to condense (liquefy) the evaporated refrigerant. Specifically, the condenser 30 is configured to cool the refrigerant by exchanging the heat with the external air to condense the refrigerant. The condenser 30 is provided with a fan (not shown) to cool the refrigerant by using the outside air blown by the fan.

The liquefied refrigerant exiting the outlet of the condenser 30 is fed to the reservoir 40.

The reservoir 40 is configured to reserve the liquefied refrigerant. The refrigerant reserved in the reservoir 40 is fed to the pump 10.

The controller 50 is configured to control the flow rate of the refrigerant. Specifically, the controller 50 is configured to control the flow rate of the refrigerant to be fed to each of the plurality of evaporators 20, based on the measured results of the temperature sensor 23, the refrigerant temperature sensor 24, and the refrigerant pressure sensor 25. The controller 50 controls the flow rate of the total amount of the refrigerants supplied to the plurality of evaporators 20 by controlling the adjustment valve 11. Further, the controller 50 controls the flow rate control valves 12 to control the flow rate of the refrigerant to be supplied to each of the plurality of evaporators 20.

The controller 50 is configured to acquire the temperature of the evaporator 20 by the temperature sensor 23. The controller 50 is configured to acquire the temperature of the refrigerant at the outlet of the evaporator 20 by the refrigerant temperature sensor 24. The controller 50 is configured to acquire the refrigerant pressure at the outlet of the evaporator 20 by the refrigerant pressure sensor 25.

Figure 6:
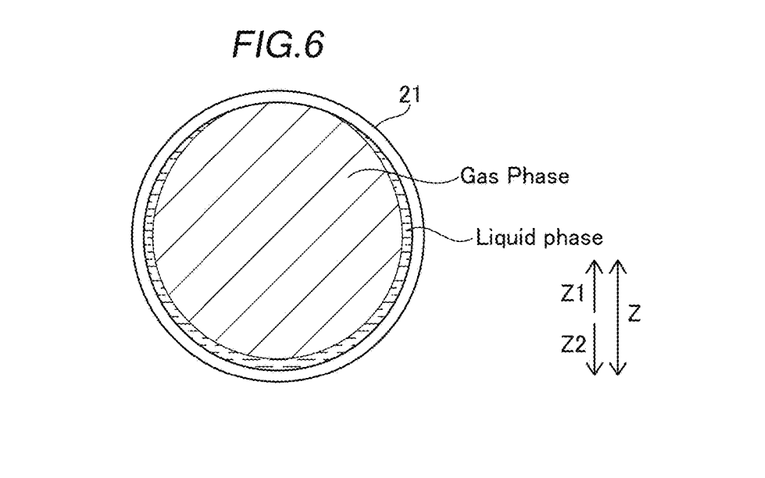
FIG. 6 is a cross-sectional view showing the case in which the refrigerant in refrigerant flow path of the evaporator according to one embodiment of the present invention is in a liquid phase and in a gas phase and dryout has occurred.

Here, in this embodiment, the controller 50 is configured to determine whether or not dryout in which the gas-phase refrigerant is in contact with the inner surface of the refrigerant flow path 21 of the evaporator 20 has occurred, based on the temperature of the evaporator 20 and the refrigerant temperature of the evaporator 20. As shown in FIG. 6, the dryout denotes a state in which the liquid-phase refrigerant disappears from a part or the entirety of the inner wall in the refrigerant flow path 21 of the evaporator 20 so that the gas-phase refrigerant is in contact with the inner wall of the refrigerant flow path 21. The occurrence of the dryout results in the deteriorated effectiveness of the heat transfer between the evaporator 20 and the refrigerant. That is, as compared with the liquid-phase refrigerant, the gas-phase refrigerant is smaller in the heat transfer coefficient, and therefore when the gas-phase refrigerant comes into contact with the inner wall of the refrigerant flow path 21, the entire heat transfer coefficient is reduced.

Here, the heat transfer amount Q is expressed by the following Equation (1) using the heat transfer coefficient h, the flow path surface area A, and the temperature difference ΔT between the temperature of the inner wall of the refrigerant flow path 21 and the temperature of the refrigerant (1).

$$Q = h \cdot A \cdot \Delta T \qquad (1)$$

As shown in Equation (1), if the heat transfer amount Q is substantially constant, when the heat transfer coefficient h reduces due to the occurrence of dryout, the temperature difference ΔT between the inner wall temperature of the refrigerant flow path 21 and the temperature of the refrigerant increases.

In other words, the occurrence of dryout causes a significant deterioration of the heat transfer coefficient between the inner wall of the evaporator 20 and the refrigerant. Thus, when dryout has occurred, the temperature differential between the inner wall of the refrigerant flow path 21 and the refrigerant increases. Therefore, by measuring the temperature of the main body 22 in the vicinity of the refrigerant flow path 21 near the outlet of the evaporator 20, it is possible to detect the occurrence of dryout. The difference between the temperature of the inner wall surface of the refrigerant flow path 21 and the refrigerant temperature at the outlet of the evaporator 20 also increases when the heat input to the evaporator 20 is large (when the heat from the heat source is large). When dryout has occurred, the temperature difference becomes larger than the maximum temperature difference during the normal operation. For example, when dryout has occurred, the temperature difference becomes greater than the temperature difference between the temperature of the inner wall of the refrigerant flow path 21 and the temperature of the refrigerant at the maximum thermal load assumed in the evaporator 20 and the refrigerant of the minimum flow rate. Thus, with reference to the maximum temperature difference between the temperature of the inner wall of the refrigerant flow path 21 and the temperature of the refrigerant during the normal operation, when it exceeds the maximum temperature difference, it is possible to determine that dryout has occurred in the evaporator 20. The maximum temperature difference between the temperature of the inner wall of the refrigerant flow path 21 and the temperature of the refrigerant during the normal operation is determined based on the design value of the amount of heat generation of the heat source.

That is, in this embodiment, the controller 50 is configured to determine that dryout has occurred in the inner surface of the refrigerant flow path 21 of the evaporator 20 when the difference between the temperature in the vicinity of the refrigerant flow path 21 at the outlet of the evaporator 20 and the refrigerant temperature at the outlet of the evaporator 20 is equal to or more the threshold temperature difference based on the design value of the amount of heat generation of the heat source. Specifically, the controller 50 is configured to determine that dryout has occurred on the inner surface of the refrigerant flow path 21 of the evaporator 20 when the difference between the temperature at the vicinity of the refrigerant flow path 21 at the outlet of the evaporator 20 and the refrigerant temperature at the outlet of the evaporator 20 is equal to or greater than the threshold temperature difference based on the design value of the amount of heat generation of the heat source during the normal operation.

Further, the controller 50 is configured to perform control to increase the flow rate of the refrigerant to be fed to the evaporator 20 when it is determined that dryout has occurred on the inner surface of the refrigerant flow path 21 of the evaporator 20. Specifically, the controller 50 is configured to perform control of the corresponding flow rate control valve 12 so as to increase the flow rate of the refrigerant to be fed to the evaporator 20 in which dryout has occurred, when it is determined that dryout has occurred in at least one of the plurality of evaporators 20.

Figure 4:
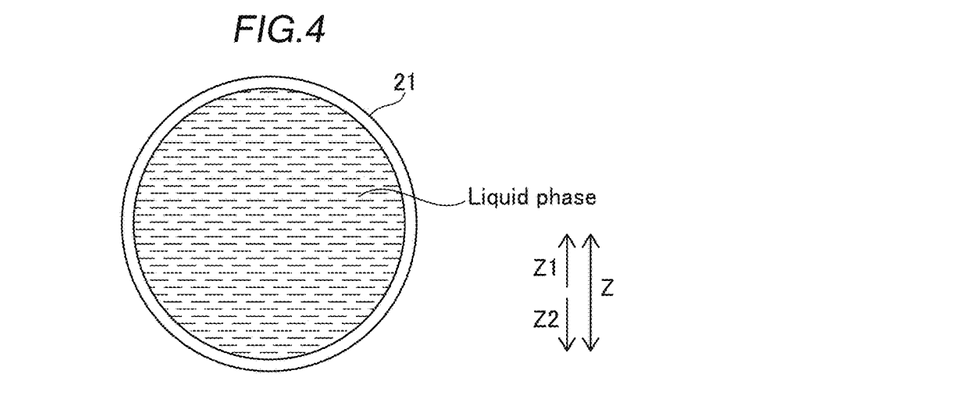
FIG. 4 is a cross-sectional view showing the case in which the refrigerant in the refrigerant flow path of the evaporator according to one embodiment of the present invention is in a liquid phase.
Figure 5:
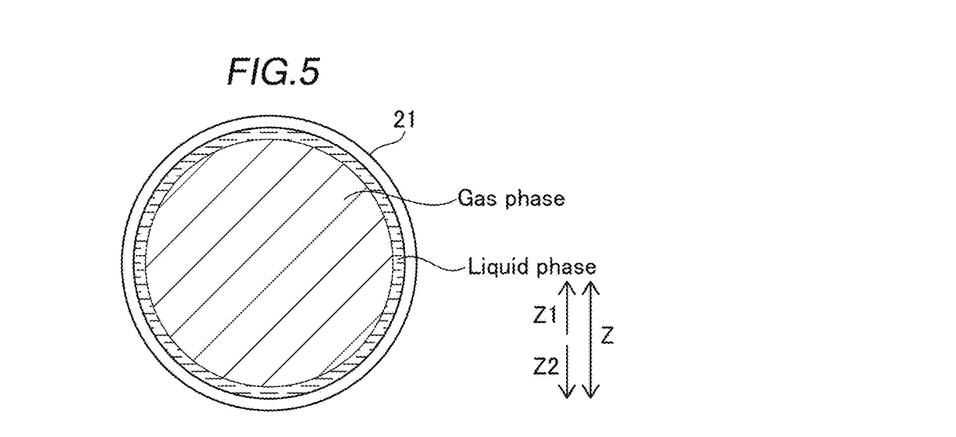
FIG. 5 is a cross-sectional view showing the case in which the refrigerant in the refrigerant flow path of the evaporator according to one embodiment of the present invention is in a liquid phase and in a gas phase.

As shown in FIG. 4, at the inlet of the evaporator 20, the refrigerant in the refrigerant flow path 21 is substantially in a liquid phase. As shown in FIG. 5, as it advances toward the downstream side of the refrigerant flow path 21, the refrigerant evaporates (vaporizes) and therefore the refrigerant in the refrigerant flow path 21 becomes in two phases, i.e., a gas phase and a liquid phase. In this case, the refrigerant in the liquid phase adheres to the inner wall of the refrigerant flow path 21. The gas-phase refrigerant flows on the inner side of the refrigerant flow path 21 because the flow velocity increases.

As the evaporation of the refrigerant progresses, as shown in FIG. 6, dryout occurs in which the gas-phase refrigerant comes into contact with the inner wall of the refrigerant flow path 21. Dryout is likely to occur in the vicinity of the outlet of the evaporator 20 where refrigerant vaporization progresses most. Further, since the refrigerant flow path 21 extends horizontally, the refrigerant also flows horizontally. A low-density gas-phase refrigerant tends to go upward, and therefore dryout is likely to occur at the upper portion in the refrigerant flow path 21. Note that dryout rarely occurs during the normal operation because the flow rate of the refrigerant is controlled. Dryout may occur such as when the flow rate of the refrigerant is reduced for some reasons.

Figure 7:
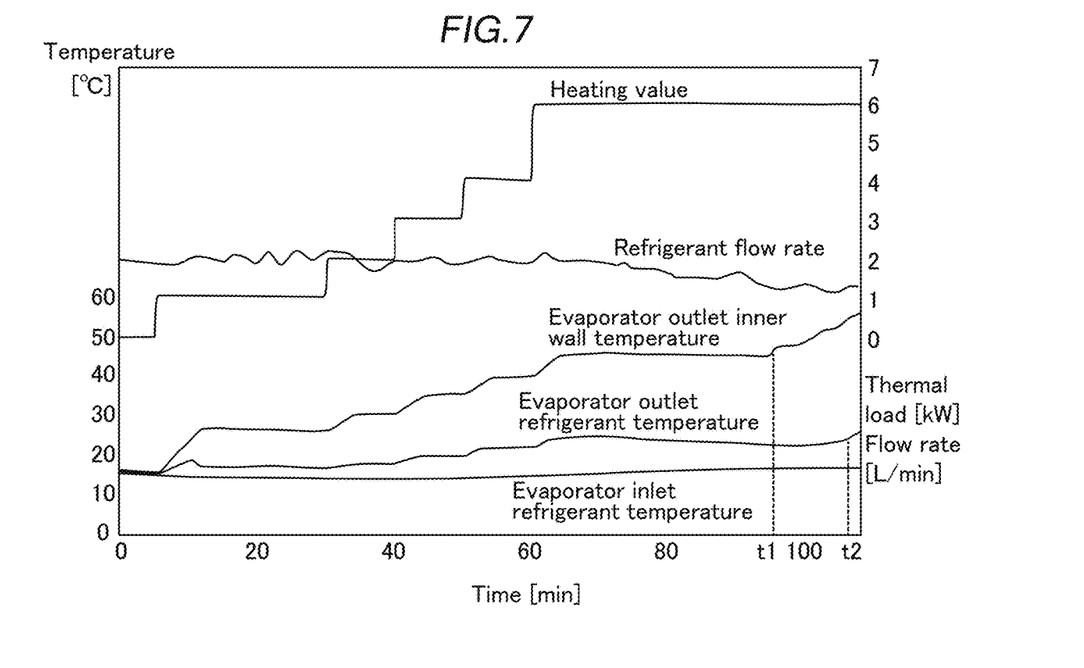
FIG. 7 is a diagram showing one example of a time change of the state of the cooling device according to one embodiment of the present invention.

In the example shown in FIG. 7, in a case where the flow rate of the refrigerant is gradually decreased in a high-heat load condition, the temporal changes in the amount of heat generation, the refrigerant flow rate, the inner wall temperature of the evaporator 20 at the outlet of the refrigerant flow path 21, the refrigerant temperature at the outlet of the evaporator 20 are shown. In the example of FIG. 7, a plurality of evaporators 20 are connected in parallel. When the flow rate of the refrigerant is reduced, dryout has occurred in one of the evaporators 20, resulting in an increased temperature of the inner wall surface of the refrigerant flow path 21. As shown in FIG. 7, at the time t1, the temperature of the inner wall surface of the outlet of the evaporator 20 has started to rise. At the time t2 which is later than the time t1, the temperature of the refrigerant at the outlet of the evaporator 20 has started to rise. Even if dryout has occurred in the evaporator 20, the refrigerant at the outlet of the evaporator 20 does not quickly rise in the temperature. Therefore, dryout can be detected earlier by detecting dryout by the difference between the temperature of the inner wall surface of the evaporator 20 and the temperature of the outlet refrigerant, as compared with the case in which the occurrence of dryout in the evaporator 20 is detected from the refrigerant state at the outlet of the evaporator 20. Further, in a state in which the evaporator 20 is not subjected to a thermal load, the difference between the temperature of the inner wall surface of the evaporator 20 and the temperature of the outlet refrigerant is zero or negligible. It is also possible to control the flow rate of the refrigerant flowing through the evaporator 20 with this temperature different triggered.

Effects of Embodiment

In this embodiment, the following effects can be obtained.

In this embodiment, as described above, the controller 50 is configured to determine whether or not dryout in which the gas-phase refrigerant is in contact with the inner surface of the refrigerant flow path 21 of the evaporator 20 has occurred, based on the temperatures of the evaporator 20 and the refrigerant temperature of the evaporator 20. With this, even in a case where the refrigerant temperature of the evaporator 20 is not increased, it is possible to determine that dryout has occurred based on the temperature rise of the evaporator 20 by the reduced heat transfer coefficient due to the occurrence of dryout. Therefore, without waiting for the increased temporal change of the refrigerant temperature due to the raised refrigerant temperature, it is possible to detect the occurrence of dryout. This makes it possible to quickly detect the occurrence of dryout. Consequently, it is possible to suppress the reduction of the cooling efficiency of the cooling device 100, and therefore it is possible to suppress the temperature rise of the electronic device 60 as a cooling target (heat source). Further, as compared with the case of using a compressor that requires higher power than the pump 10, the cooling device 100 for performing cooling by utilizing the latent heat of vaporization without using a compressor can be simplified in the device configuration and the device can be miniaturized. Further, the cooling device 100 for performing cooling by utilizing the latent heat of vaporization without using a compressor can reduce the circulation amount of the refrigerant, as compared with the case of utilizing only the temperature change (sensible heat) of the refrigerant without using the latent heat of vaporization, it is possible to reduce the output of the pump 10. This also makes it possible to reduce the size of the apparatus. Such effects are particularly useful in the case of using the cooling device for a moving body 200 in which miniaturization of the equipment to be mounted is desired.

Further, in this embodiment, as described above, the controller 50 is configured to determine that dryout has occurred on the inner surface of the refrigerant flow path 21 of the evaporator when the difference between the temperature of the vicinity of the outlet of refrigerant flow path 21 of the evaporator 20 and the refrigerant temperature at the outlet of the evaporator 20. With this, it is possible to determine the discrimination between the case in which the heat input to the evaporator 20 is large and the case in which dryout has occurred, based on the temperature difference between the temperature in the vicinity of the refrigerant flow path 21 at the outlet of the evaporator 20 based on the design value of the amount of heat generation of the heat source and the refrigerant temperature at the outlet of the evaporator 20. Therefore, it is possible to easily determine whether or not dryout has occurred.

Further, in this embodiment, as described above, the controller 50 is configured to perform control to increase the flow rate of the refrigerant to be fed to the evaporator 20, when it is determined that dryout has occurred on the inner surface of the refrigerant flow path 21 of the evaporator 20.

With this, the flow rate of the liquid-phase refrigerant to be fed to the evaporator 20 can be increased based on the quickly detected occurrence of the dryout, and therefore it is possible to quickly eliminate the dryout.

Further, in this embodiment, as described above, the temperature sensor 23 is provided above the refrigerant flow path 21 in the vicinity of the outlet of the evaporator 20, and the controller 50 is configured to acquire the temperature of the evaporator 20 by the temperature sensor 23. With this, in the vicinity of the outlet of the evaporator 20 where the vaporization of the refrigerant is most facilitated, the temperature sensor is provided above the refrigerant flow path 21 where dryout first occurs by the effect of the gravitational force, the occurrence of dryout can be quickly detected based on the temperature of the temperature sensor 23.

Further, in this embodiment, as described above, in a case where it is determined that dryout has occurred in at least one of the plurality of evaporators 20, the controller 50 is configured to perform control of the corresponding flow rate control valve 12 so as to increase the flow rate of the refrigerant to be fed to the evaporator 20 in which dryout has occurred. With this, in a case in which a plurality of evaporators 20 is provided for one pump 10, it is possible to quickly detect the occurrence of dryout for each of the plurality of evaporators 20, and it is possible to quickly resolve the dryout of the evaporator 20 in which dryout has occurred.

Further, in this embodiment, as described above, the evaporator 20 is configured to be in contact with the electronic device 60 as a heat source to remove the heat of the electronic device 60 by heat conduction. With this, unlike the case in which air is cooled by an evaporator 20 and a cooling electronic device 60 is cooled by blowing the cooled air, it is possible to directly cool the electronic device 60. As a result, it is not required to provide a device for blowing the cooled air, which makes it possible to simplify the device configuration. Further, since it is not required to provide a space for blowing cooled air, it is possible to reduce the size of the device.

In this embodiment, as described above, the refrigerant has a boiling point of 15° C. or above and 50° C. or below. With this, since the boiling point (liquefaction temperature) is close to the normal temperature, the gas-phase refrigerant can be easily liquefied by the condenser 30 without using a compressor.

Further, in this embodiment, as described above, the cooling device 100 is mounted on a moving body 200. This makes it possible to efficiently cool the electronic device 60 (heat source) mounted on the moving body 200 by the cooling device 100 capable of quickly detecting the occurrence of dryout.

Modifications

It should be understood that the embodiments disclosed here are examples in all respects and are not restrictive. The scope of the present invention is indicated by the appended claims rather than by the description of the above-described embodiments and includes all modifications (changes) within the meanings and the scopes equivalent to the claims.

For example, in the above-described embodiment, an example is shown in which it is configured such that three evaporators are connected to one pump (liquid feeding unit), but the present invention is not limited thereto. In the present invention, 1, 2, or 4 or more evaporators may be connected to one liquid feeding unit. Further, in a case where one evaporator is provided in one liquid feeding unit, an adjustment valve or a flow rate control valve may not be provided.

Further, in the above-described embodiment, an example is shown in which freon is used as a refrigerant, but the present invention is not limited thereto. In the present invention, a material other than freon may be used as a refrigerant. The boiling point of the refrigerant at one atmospheric pressure may be less than 15° C. or greater than 50° C.

Further, in the above-described embodiment, an example is shown in which the evaporator and the heat source are arranged so as to be in contact with each other to remove the heat of the heat source by heat conduction. However, the present invention is not limited thereto. In the present invention, it may be configured such that a fluid, such as, e.g., air and liquid, is cooled by an evaporator to remove the heat of the heat source by the cooled fluid.

Further, in the above-described embodiment, an example is shown in which an electronic device as a heat source is cooled, but the present invention is not limited thereto. In the present invention, a heat source other than an electronic device may be cooled.

Further, in the above-described embodiment, an example is shown in which the cooling device is provided on the moving body, but the present invention is not limited thereto. In the present invention, the cooling device may be provided on a body other than a moving body.

Further, in the above-described embodiment, an example is shown in which the evaporator is provided with a pipe-shaped refrigerant flow path, but the present invention is not limited thereto. In the present invention, the evaporator may be an evaporator provided with a refrigerant flow path other than the pipe-shaped refrigerant flow path.

Further, in the above-described embodiment, an example is shown in which the refrigerant is cooled by blowing air by the fan in the condenser, but the present invention is not limited thereto. In the present invention, the condenser may be provided with a chiller to cool the refrigerant by using a circulating cooling water. Further, a cooling source (heat sink) may be provided in the condenser to cool the refrigerant.

Figure 8:
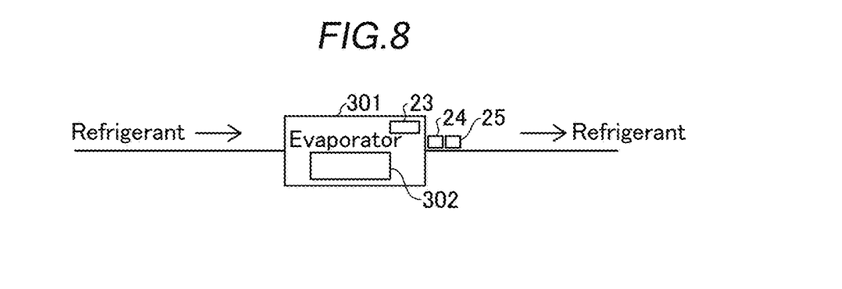
FIG. 8 is a block diagram showing a liquid feeding unit of the cooling device according to a modification of one embodiment of the present invention.

Further, in the above-described embodiment, an example is shown in which a pump is used as a liquid feeding unit for feeding the refrigerant, but the present invention is not limited thereto. In the present invention, a porous material 302 may be used as a liquid feeding unit, like the modification shown in FIG. 8. In this case, the porous material 302 is provided in the evaporator 301 and functions as a capillary tube to feed the liquid while allowing refrigerant to permeate. The refrigerant fed by the porous material 302 removes the heat from the heat source to be evaporated.

DESCRIPTION OF SYMBOLS

10: Pump (liquid feeding unit)
12: Flow rate control valve
20: Evaporator
23: Temperature sensor
30: Condenser
50: Controller
60: Electronic device (heat source)
100: Cooling device
200: Moving body
301: Evaporator
302: Porous material (liquid feeding unit)

The invention claimed is:

1. A cooling device for performing cooling by utilizing latent heat of vaporization without using a compressor, the cooling device comprising:
   a liquid feeding unit configured to feed a refrigerant;
   an evaporator configured to evaporate the fed refrigerant;
   a condenser configured to condense the evaporated refrigerant;
   a controller configured to control a flow rate of the refrigerant;
   a first temperature sensor configured to acquire a temperature of a wall of the evaporator; and
   a second temperature sensor configured to acquire a refrigerant temperature in a refrigerant flow path of the evaporator and is different from the first temperature sensor,
   wherein the controller is configured to determine whether or not dryout has occurred based on a difference between the temperature of a wall of the evaporator acquired by the first temperature sensor and the refrigerant temperature in the refrigerant flow path of the evaporator acquired by the second temperature sensor, the dryout being defined as a state in which a gas-phase refrigerant is in contact with an inner surface of the refrigerant flow path of the evaporator, and
   wherein the first temperature sensor and the second temperature sensor are provided in the vicinity of an outlet of the evaporator.

2. The cooling device as recited in claim 1,
   wherein the controller is configured to determine that the dryout has occurred on the inner surface of the refrigerant flow path of the evaporator when the difference between the temperature of a wall of the evaporator acquired by the first temperature sensor and the refrigerant temperature in the refrigerant flow path of the evaporator acquired by the second temperature sensor is equal to or greater than a threshold temperature difference based on a design value of an amount of heat generation of a heat source.

3. The cooling device as recited in claim 1,
   wherein when the controller determines that the dryout has occurred on the inner surface of the refrigerant flow path of the evaporator, the controller is configured to perform control to increase a flow rate of the refrigerant to be fed to the evaporator.

4. The cooling device as recited in claim 1,
   wherein the first temperature sensor is provided in the vicinity of the refrigerant flow path near the outlet of the evaporator, and
   wherein the controller is configured to acquire the temperature of the evaporator by the first temperature sensor.

5. The cooling device as recited in claim 1,
   wherein the cooling device includes a plurality of the evaporators, and the liquid feeding unit includes a pump capable of feeding the refrigerant to the plurality of the evaporators,
   wherein the cooling device further comprises a plurality of flow rate control valves each for adjusting a flow rate of the refrigerant to each of the plurality of evaporators, and
   wherein when the controller determines that the dryout has occurred in at least one of the plurality of the evaporators, the controller is configured to perform control of the flow rate control valve corresponding to the at least one of the plurality of the evaporators in which the dryout has occurred so as to increase the flow rate of the refrigerant to be supplied to the at least one of the plurality of the evaporators.

6. The cooling device as recited in claim 1, wherein the evaporator is configured to be in contact with a heat source to remove heat of the heat source by heat conduction.

7. The cooling device as recited in claim 1, wherein the refrigerant has a boiling point of 15° C. or above and 50° C. or below.

8. The cooling device as recited in claim 1, wherein the cooling device is configured to cool an electronic device.

9. The cooling device as recited in claim 1, wherein the cooling device is configured to be mounted on a moving body.

* * * * *